United States Patent [19]
Pierson et al.

[11] Patent Number: 6,059,939
[45] Date of Patent: May 9, 2000

[54] METHOD FOR HIGH DENSITY EDGE MOUNTING OF CHIPS

[75] Inventors: Mark Vincent Pierson, Binghamton; Thurston Bryce Youngs, Jr., Vestal, both of N.Y.

[73] Assignee: International Business Machines Corporation, Armonk, N.Y.

[21] Appl. No.: 09/225,316

[22] Filed: Jan. 5, 1999

Related U.S. Application Data

[62] Division of application No. 08/785,195, Jan. 17, 1997, Pat. No. 5,903,437.

[51] Int. Cl.[7] .......................... C23C 14/34; C23C 16/00; C23C 4/08; B05D 1/18; H01L 21/31
[52] U.S. Cl. .................. 204/192.12; 438/758; 438/106; 427/455; 427/576; 427/584; 427/585; 427/250; 427/437
[58] Field of Search .......................... 204/298.11, 192.12, 204/192.15, 192.3, 192.17; 427/564, 566, 455, 523, 526, 531, 576, 584–588, 250–252, 555, 437; 438/710, 719, 758, 106, 109, 113

[56] References Cited

U.S. PATENT DOCUMENTS

| | | |
|---|---|---|
| 4,266,282 | 5/1981 | Henle et al. . |
| 4,551,629 | 11/1985 | Carson et al. . |
| 4,706,166 | 11/1987 | Go . |
| 4,922,378 | 5/1990 | Malhi et al. . |
| 4,980,002 | 12/1990 | Dzarnoski, Jr. et al. . |
| 4,983,533 | 1/1991 | Go . |
| 4,992,908 | 2/1991 | Solomon . |
| 4,999,311 | 3/1991 | Dzarnoski, Jr. et al. . |
| 5,025,306 | 6/1991 | Johnson et al. . |
| 5,031,072 | 7/1991 | Malhi et al. . |
| 5,075,253 | 12/1991 | Sliwa, Jr. . |
| 5,104,820 | 4/1992 | Go et al. . |
| 5,113,315 | 5/1992 | Wheeler et al. . |
| 5,146,308 | 9/1992 | Chance et al. . |
| 5,229,916 | 7/1993 | Frankeny et al. . |
| 5,239,199 | 8/1993 | Chiu . |
| 5,266,833 | 11/1993 | Capps . |
| 5,279,991 | 1/1994 | Minahan et al. . |
| 5,327,327 | 7/1994 | Frew et al. . |
| 5,347,428 | 9/1994 | Carson et al. . |
| 5,356,838 | 10/1994 | Kim . |
| 5,362,986 | 11/1994 | Angiulli et al. . |
| 5,380,681 | 1/1995 | Hsu . |
| 5,397,747 | 3/1995 | Angiulli et al. . |
| 5,424,920 | 6/1995 | Miyake . |
| 5,426,563 | 6/1995 | Moresco et al. . |
| 5,426,566 | 6/1995 | Beilstein, Jr. et al. . |
| 5,455,455 | 10/1995 | Badehi . |
| 5,455,740 | 10/1995 | Burns . |
| 5,478,781 | 12/1995 | Bertin et al. . |
| 5,502,667 | 3/1996 | Bertin et al. . |
| 5,744,016 | 4/1998 | Yamada et al. ................... 204/298.11 |

*Primary Examiner*—Nam Nguyen
*Assistant Examiner*—Gregg Cantelmo
*Attorney, Agent, or Firm*—Whitham, Curtis & Whitham; Lawrence R. Fraley

[57] ABSTRACT

An integrated circuit package derives increased mechanical robustness and electrical reliability consistent with increased heat dissipation capacity by edge bonding of integrated circuit chips onto a substrate such as a chip, board, module or another integrated circuit by forming a solder or conductive adhesive bond between a bonding/contact pad on the substrate and a metallization feature extending at least on limited opposing areas of major surfaces of the chip and, preferably, across the edge of the chip. Thermally conducting material contained in a cap may provide additional, distributed support for the chip by a combination of viscosity and density providing buoyancy of the chips. Alternatively, a cap may be provided which further stabilizes the edge-mounting of chips while increasing velocity of cooling fluid against the chips. Novel techniques of forming a metallization feature across the edge of a chip with high efficiency and manufacturing yield includes enclosure of chips or strips of chips in a tool including a grooved mask or enclosing the chips or strips of chips in a resist which may be exposed and developed using at least a portion of the same tool.

10 Claims, 2 Drawing Sheets

METHOD FOR HIGH DENSITY EDGE MOUNTING OF CHIPS

This is a divisional application of U.S. application Ser. No. 08/785,195 filed on Jan. 17, 1997, now U.S. Pat. No. 5,903,437 issued May 11, 1999.

BACKGROUND OF THE INVENTION

1. Field of the Invention

The present invention generally relates to packaging of electronic circuits and, more particularly, to the edge-mounting of integrated circuit chips at high density.

2. Description of the Prior Art

It has been recognized that substantial performance gains as well as manufacturing economies can be achieved from high integration density of electronic circuits. Short signal paths reduce signal propagation time and are less susceptible to effects of noise as well as presenting reduced resistance and capacitance to be driven by individual active circuits therein. Manufacturing economies derive from the reduced number of chips or wafers which must be subjected to lengthy and complex processes requiring expensive and specialized equipment in order to form the desired circuits.

Accordingly, technologies have been developed which provide good manufacturing yields of integrated circuits using design rules providing minimum feature size of only a fraction of a micron, allowing millions of circuit elements to be formed on a single chip. Some techniques such as sidewall image transfer (STI) allow the formation of structures which are smaller than the limit of lithographic resolution and further increases in integration density are foreseeable. However, as the number of circuit elements on a single chip is increased, manufacturing yield may be compromised and a trade-off between integration density (with commensurate performance gains and economy per chip) and overall economy of manufacture is unavoidable.

There are several other practical limitations on the amount of circuitry which may be included on a single chip and signal propagation time through a circuit element (e.g. maximum switching frequency), as well. First, there is a practical limit on chip size since a chip will usually be subjected to mechanical stresses from both accelerations and thermal cycling in normal use. Since semiconductor substrates are somewhat delicate and substrates somewhat brittle, increased chip dimensions correlate with increased likelihood of mechanical damage. As a second but related issue, each active device in the integrated circuit will produce some amount of heat which must be dissipated since elevated temperatures may cause change of the electrical properties of circuit elements on the chip. The amount of heat generally increases as cycle time is reduced and switching frequency increases. Therefore, no more active devices may be included in an integrated circuit than can be accommodated by heat transfer arrangements to maintain chip temperature in an acceptable range at the desired switching frequency of the design. Thus many circuits in which high performance is of paramount importance include cooling arrangements which may be many times the size, weight and cost of the electronic circuits themselves.

Another practical consideration in many devices is process incompatibility between various semiconductor circuit technologies. While numerous so-called hybrid technologies are known (e.g. BiCMOS which provides bipolar transistors and field effect transistors of both conductivity types on the same chip) there will often be requirements for devices which cannot be economically formed on the same chip. For this and the above-noted reasons, most electronic devices will require a plurality of chips to form the complete device.

When plural chips are used, the same types of performance gains may be realized by the packaging employed in order to minimize connection length, signal propagation time, noise immunity and the like. For example, so-called multi-layer modules have been formed by lamination of sheets of polymer or ceramic to provide compact arrangements of complex connections between potentially hundreds of individual chips. However, using such modular packaging, chips are mounted in a generally coplanar manner and worst case wiring length may be up to several inches in some signal paths which, while seemingly short, may be several orders of magnitude longer than wiring on a single chip. Further, while the multi-layer module may be made of a material which is has good thermal conduction properties and may be mechanically coupled to a heat exchange structure for removing heat from the chips, heat exchange performance in combination with simpler cooling mechanisms such as convection or forced air circulation is generally very poor.

To address both wiring length and heat exchange concerns, it has been proposed to mount chips on edge. For example, "Edge-Mounted Chip Assembly for Microprocessors" by H. I. Stoller, IBM Tech. Discl. Bull.; Vol. 23, No. 5; pp. 581–582, July, 1980, describes back bonding of a master chip, such as a processor, to a substrate which carries connection pins and bonding edges of slave chips such as I/O circuits and memory chips to the front surface of the master chip by solder reflow. The slave chips may be free-standing or assembled together in a "loaf" which may also include dummy chips. The assembly is completed by placing a "hat" or can over the master and slave chips to contain thermal grease filling the space between the chips and the interior of the "hat".

However, as recognized therein, free-standing, edge-mounted chips are not as mechanically robust as the "loaf" configuration in which the chips support each other and, together, present a larger "footprint" on the master chip. In particular, under an acceleration, each free-standing slave chip is essentially cantilevered from the master chip. A practical width of each chip in comparison with a practical thickness also places the electrical connection to the edge of the chip at a mechanical disadvantage. Since the electrical bonding also provides mechanical support for the chip, fatiguing of the electrical bond which must be formed of solder may occur, compromising reliability. The mechanical load transferred to the master chip is essentially a pair of compression and tension forces in close proximity which tends to twist the master chip and may cause mechanical damage thereto.

Further, while the "loaf" configuration may also provide good temperature equalization between chips, cooling capacity is limited because of the limited surface area of the "loaf" for heat exchange and the document notes that the "loaf" configuration is preferred only if "relatively few active slave chips are required"; the remainder of the loaf being formed by dummy chips. Therefore, such a structure presents the designer with a choice between mechanical robustness and heat dissipation.

Edge-mounted chips also suffer from some other practical disadvantages due to the mechanical configuration and spatial relationships of the chips. For example, the front surface of an integrated circuit formed at high integration density is unlikely to be planar without substantial further processing and metallization to raise contacts through a relatively thick passivation layer which will support planarization. Without planarization, flatness tolerance better than 1–2 mils cannot be expected even at locations which may be designed for edge mounting of a chip. In contrast, the edge of a chip to be mounted thereon is generally formed with an optically guided diamond saw and is therefore usually highly linear. Thus, it can be understood that the edge of a chip is not particularly well-matched to the surface topography of a chip or substrate.

Planarization of the master chip also essentially precludes the formation of separate support structures on the master chip surface and which, in any event, are difficult to manufacture and to mount on the master chip surface. U.S. Pat. No. 4,992,908 to A. L. Solomon is exemplary of a complex arrangement of angled surfaces as an attempt to increase mechanical support and improve proximity of surfaces to be bonded. Another complex arrangement involving separated parallel busses is disclosed in U S. Pat. No. 5,266,833 to D. F. Capps.

It should also be appreciated that formation of solderable connection pads on the edges of a chip is not trivial, particularly where spacing or feature size must be small to provide a sufficient number of contacts in addition to forming the edges to seat against the surface to which they are joined with sufficient proximity to allow reliable bonds to be formed. The above U. S. Patent to Capps, for example, proposes disposing fine electrical wires in a rectangular grid array within a semiconductor material while the semiconductor crystal is being grown and then cut into wafers and dicing the chips from the wafer at locations coinciding with the grid array. Such a process would clearly be extremely complex, replete with exacting alignment tolerances and prohibitively expensive even if good yield could be obtained.

Therefore, manufacturing yield of the assembled package may be compromised by separations of contacts on respective chip surfaces and which must be bridged by solder (which is generally composed of soft metal) or a conductive adhesive; neither of which is well-suited to providing good mechanical support when a significant gap exists. Further, since the required volume of solder or conductive adhesive is somewhat unpredictable in view of the potential irregularity of separation between contacts on respective chip surfaces, reflow may not succeed in achieving a solder bond if insufficient solder is present or may bridge closely spaced contacts if the amount of solder is excessive and reflow is not directed by the extent of metallization or solder wettable surfaces.

Additionally, the soldering process, itself, is difficult in such structures since the bonding pads formed on the respective chips are not readily accessible for the application of heat. Therefore, it has been the practice to provide extensions on the connection pads, such as is disclosed in U.S. Pat. No. 4,266,282 to Henle et al., which limits the proximity of the edge mounted chips (e.g. precluding a "loaf" configuration) or to form the solder bonding in furnaces using complex jigs and presses and often resulting in improper bond formation.

In summary, there has been no simple arrangement for producing robust mechanical and electrical bonds for edge-mounting of chips on another chip or substrate consistent with sufficient heat dissipation for high speed integrated circuits formed at very high integration density. Further, there has been no convenient and simple process for edge-mounting of chips with high manufacturing yield.

SUMMARY OF THE INVENTION

It is therefore an object of the present invention to provide a structure for facilitating edge mounting of chips on a substrate or another chip.

It is another object of the invention to provide a structure for forming electrical connections to the edge of a chip which can be formed with enhanced reliability and increased mechanical robustness.

It is a further object of the invention to provide a structure for the mounting of high density integrated circuits on another chip or substrate which develops increases mechanical strength and electrical reliability as well as increased heat dissipation capability.

It is a further object of the invention to provide a practical method for metallization of edges of chips in a manner to provide improved electrical and mechanical bonding to another surface.

In order to accomplish these and other objects of the invention, an electronic integrated circuit package is provided including a substrate including a bonding pad, and an integrated circuit chip having a metallization feature including metallization on opposing areas on major surfaces of the chip and bonded at its edge to the substrate by a bond between the bonding pad and the metallization feature.

In accordance with another aspect of the invention, a method of forming a metallization feature on an edge of a chip and extending onto both major surfaces of the chip is provided, comprising the steps of enclosing said chip in a mask which exposes an area on an edge of a chip and areas on major surfaces of the chip contiguous to the area on the edge of the chip, and applying metal to areas exposed by the mask.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
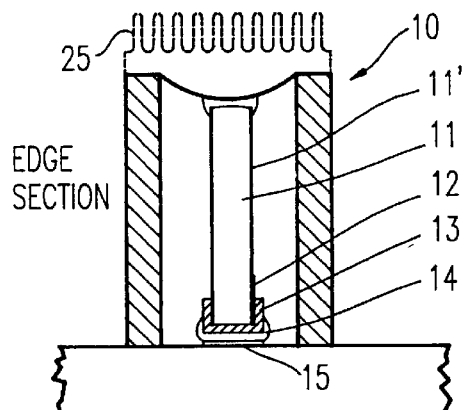
FIG. 1 is a cross-sectional view of the packaging arrangement for edge-mounting of chips in accordance with the invention.
Figure 1A:
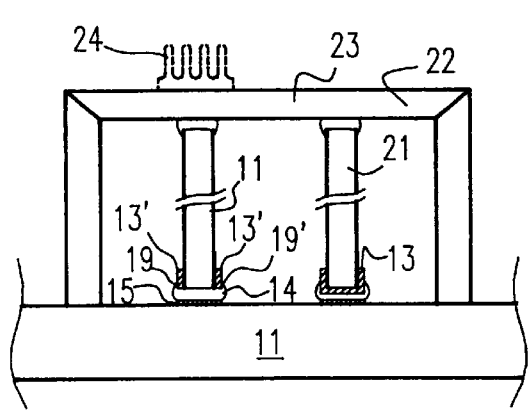
FIG. 1a shows a similar cross-sectional view of an alternative form of edge metallization in accordance with the invention.

Referring now to the drawings, and more particularly to FIG. 1, there is shown a cross-sectional view of an integrated circuit (IC) packaging arrangement 10 in accordance with the invention; the cross-sectional view being taken in a direction parallel to respective chips included therein. It should be understood that while only a single edge-mounted chip is illustrated in this view in the interest of clarity, a plurality of chips as illustrated in FIG. 1a may be similarly bonded to substrate 16 (which may, itself, be an IC chip) in accordance with the principles of the invention.

Figure 2:
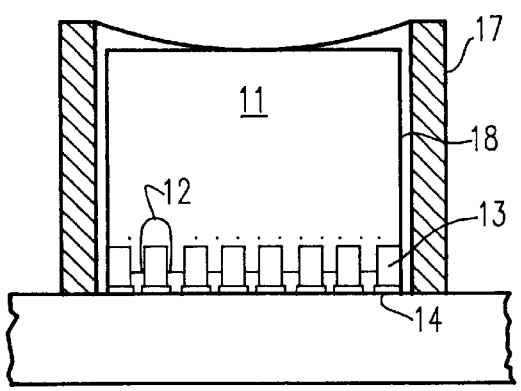
FIG. 2 is a cross-sectional view of the packaging arrangement in accordance with the invention taken in a direction orthogonal to the cross-sectional view of FIG. 1.

In essence, the structure for edge-mounting of each chip 11 in accordance with the invention comprises a plurality of contact structures 12, as shown more clearly in FIG. 2, which are accessible from the chip surface (generally through or over a passivation layer 11a (FIG. 1) a contact from a via on the substrate side of the chip), a metallization feature 13, (collectively being a highly conductive layer, a barrier layer and a passivation layer) a bonding material 14 such as solder or a conductive adhesive, for connection of the metallization feature 13 to a bonding pad 15 on another surface 16 such as another chip, substrate, card or module. As perfecting features of the invention, a housing 17, preferably in the form of a can or frame may be provided, particularly for containing a thermal grease or oil 18.

Metallization feature 13 is preferably of a U-shaped form which extends for some distance along each of the major surfaces (e.g. front and back/substrate) of the chip as well as across an edge of the chip. Alternatively, the portion of the metallization across the edge of the chip can be omitted and metallization feature 13 formed as a pair of opposed surface area metallizations 13' as shown in FIG. 1a, in which case bond 19 can be formed to chip surface metallization for electrical connection while bond 19' can be formed for additional mechanical robustness (or vice-versa) at the location where greatest mechanical advantage may be obtained. It should be noted that if solder 14 is used to form bonds 19 and 19' and both bonds are made to the same metal pad 15, solder will flow under the edge of the chip, bridging the surface metallization and enhancing both the electrical and mechanical properties of the bonds. If a conductive adhesive is applied to the edge or sides of the chip, sufficient volume should be provided to cause slight extrusion of adhesive as depicted to the sides of the chip as well as in the gap between the chip 11 and mounting surface 16.

It should be appreciated that the U-shaped metallization feature 13 is of substantial (but not critical) thickness to provide for a sufficient volume of metal to withstand repeated soldering operations since many metals which may be used as a conductive or barrier layer may have significant solubility in solder and since metal may be abraded in some soldering operations. For this reason, it is preferred that the overall thickness of the metallization feature (including an adhesion layer 13a (FIG. 2) which need not be thicker than about 100 Angstroms) be at least several tens of thousands of Angstroms, approximately 80,000 Angstroms being a preferred target thickness. It should also be recognized that such thicknesses as are preferred for the practice of the invention are greater than accepted nominal values for surface metallizations as currently practiced in the art and which are generally less than one mil in thickness. The metalization feature further includes a highly conductive layer 13b and a barrier layer 13c (FIG. 2).

In either form of metallization, it should be appreciated that surface metallization is available on the sides of the chip for contact by a heated probe to form a solder bond and also for improved heat transfer from a radiant energy (e.g. visible, infrared, ultraviolet, etc.) source or oven for either original manufacture or reworking of the assembly. The metallization on the major surfaces of the chip provided by metallization feature 13 or 13' also provides direction of reflow of any excess solder without requiring significant space on the master chip 16 (e.g. in the case where such reflow was directed by metallization 15). If a radiation source such as a laser is used as the radiant energy source, some surface treatment (e.g. oxidation or material deposition) should be provided to reduce reflectivity of the metal and enhance radiant energy absorption. Therefore, it is seen that the invention provides substantial process flexibility for the edge-mounting of chips.

It should be noted that the same form of metallization features 13, 13' is not required on all chips, as shown in FIG. 1a in which the U-shaped metallization feature 13 as also illustrated in FIG. 1 is used on chip 21. It is similarly not necessary to the successful practice of the invention to have metallization features of a uniform type on any given chip although it is considered to be highly preferable and convenient for a uniform type of metallization feature 13, 13' to be used on a single chip.

Also shown in FIG. 1a is a yoke-type cap 23 which may be used to advantage in many applications of the invention. Specifically, yoke-type cap 23 is preferably formed of a substantially rigid material and open on two sides (e.g. above and below the plane of the page of FIG. 1a). The rigidity serves to mechanically protect the edge-mounted chips enclosed thereby and it is preferred that the cap be relatively thick or shaped in order to achieve adequate mechanical strength. Advantageously, ribs 24 may be formed on the outside, inside or both for both stiffening of the cap and increasing heat transfer by increase of surface area. The thickness or shaping of the cap in combination with the open sides thereof may also provide an inwardly convex surface (e.g. curved or faceted) to accelerate fluid (e.g. air) flow therethrough by convection or forced fluid movement (e.g. by a fan) to enhance cooling.

It is also preferred to provide mechanical connection 22 (which could also be used to carry electrical signals or power) of the yoke-type cap to another edge of the enclosed chips to enhance mechanical robustness and reduce movement in response to accelerations. Reduced movement avoids fatiguing of bonds 14 or metallizations 13, 13', 15 and reduces stressing of chips 11, 21 or substrate 16 as well as forming a thermal path for heat transfer.

Figure 1B:
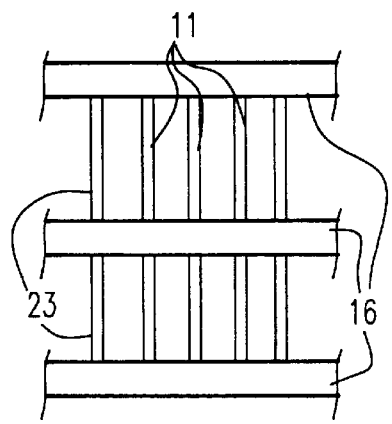
FIG. 1b illustrates a configuration of a variant application of the principles of the invention.

It should also be understood that a portion of the yoke-type cap 23 could be formed by another substrate of chip 16 as is schematically shown at reduced scale in FIG. 1b. Thus, the other portions of the yoke-type cap 23 essentially form a plenum comprising a plurality of cells, each cell including one or more edge mounted chips. Of course, the structure could also be expanded in the direction of the cut lines depicted in connection with substrates or chips 16, forming an array of (e.g. rectangular) cells, as may be convenient or desirable.

Alternatively, an annular or, preferably, closed cap 17 may be used to contain a thermally conductive but electrically non-conductive material such as a thermal grease or cooling oil 18. A heat sink may be attached to either type of cap or provided as ribs on cap 17 and, advantageously, the heat sink, itself, (or another substrate or chip, as discussed above) may be used as a closure for the cap as shown at 25 of FIG. 1. While the specific thermally conductive material is not critical to the practice of the invention several aspects of the material are important to design of a package in accordance with the invention for a particular application. of course, the thermal conductivity of the material and the anticipated requirements for heat dissipation must be considered in designing the dimensions of the thermal paths between the edge-mounted chips, as is well-understood in the art. However, additional support for the chips may be achieved without localization of stresses (as would occur with solid supports as in the "loaf" structure alluded to above or other known structures) from the viscosity, relative degree of incompressibility of the material and the proximity of edge-mounted chips and cap.

Further, the viscosity of the material together with resistance to flow against the chips and cap 17 will also provide damping of relative movement of the edge-mounted chips. The chip spacing of the package design relative to viscosity of the material 18 should also consider the possibility of convection flow of material 18 within the can 17 to enhance heat dissipation. Further, while close matching of the density of the material 18 and the chips 11, 21 is not generally possible, lower viscosity of material 18 can generally be partially compensated by the buoyancy of the chips in the material 18 which tends to reduce relative movement of the chips in response to accelerations. That is, to the extent that the density of material 18 can be made to match the density of the chips, accelerations may cause slight localized pressure changes within the can but with very little flow of material 18 or movement of chips 11, 21.

Viscosity, thermal conductivity, and density or specific gravity are generally provided in literature descriptive of available materials. Further, other non-conductive materials can be added to the thermally conductive material to adjust specific gravity or viscosity or both with, in many cases, minimal change in thermal conductivity. Therefore, design of particular configurations in accordance with the principles of the invention will be evident to those skilled in the art in view of the present disclosure.

Thus, in view of the foregoing, it is seen that the combination of various elements of the preferred embodiment of the invention and variants thereon described above can provide improved mechanical robustness and electrical reliability consistent with increased capacity for heat dissipation. Accordingly, higher integration density and increased proximity of chips can be achieved to reduce signal propagation time through connections in the package consistent with higher switching frequencies and consequently higher heat dissipation.

As alluded to above, however, the formation of metallization features 13, 13', particularly at small feature size or in close proximity, is not trivial and the provision of suitable structures for manufacture of the above-described structure is an important aspect of the present invention. While the invention could be practiced using only surface metallization features 13' as discussed above in connection with FIG. 1a, some difficulties of registration and alignment for dicing of the chips or even adhesion of the metal to the chip as the wafers are diced may compromise manufacturing yield even though metallization on major surfaces of a chip is a well-developed process.

The reason for difficulty of edge metallization is largely due to difficulties of handling of chips and definition (e.g. masking or exposure) of discrete areas on an extremely narrow surfaces of individual chips. In contrast, metallization on major surfaces is usually done on a wafer prior to dicing the wafer into chips (which forms the edges where metallization is desired). Moreover, common methods of handling and positioning of chips for processing generally involves contact with and across the substrate side of the chip which may limit access to the chip edges and prevents processing of the surface of the chip by which it is held or manipulated. Therefore, using conventional metallization processes, even if appropriate to edge metallization, would at least require separate metal deposition steps and careful alignment of the chips between deposition steps in order to cause metallization to extend onto both major surfaces of the chip. In summary, the scope of difficulties in processing chip edges may perhaps be best appreciated by considering that most lithographic and other processes involved in semiconductor manufacture involve a generally planar area whereas development of a metallization feature on a chip edge and extending onto both major surfaces of the chip requires processing of a three-dimensional object including simultaneous processing from two substantially opposing directions and a third direction substantially orthogonal thereto.

Figure 3:
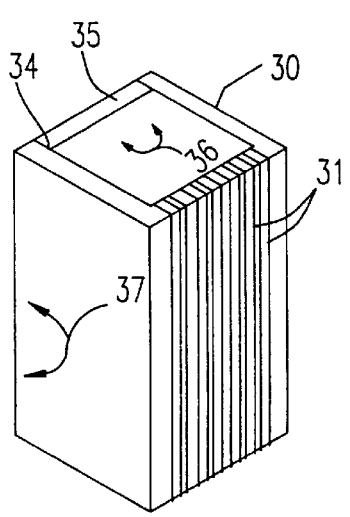
FIG. 3 illustrates use of a comb mask for performing edge metallization of chips in accordance with a preferred method of practicing the invention.

To solve these problems with conventional metallization processes, in accordance with the invention, the individual chips are enclosed in a mask as opposed to forming a mask only on a major surface thereof. A preferred form of such a mask is illustrated in FIG. 3 and is in the form of a tube 30 which is shaped and sized such that the inside dimensions closely follow the perimeter of the chips to be processed. A removable panel 35 is preferably provided by forming slits 34 to facilitate cleaning and insertion of chips and to allow dimensional adjustment to firmly engage the inserted chips. The use of such a tube configuration allows the processing of a plurality of chips to be simultaneously carried out to develop metallization features 13.

Incidentally, since metallization for edge mounting may be appropriate only on less than all sides (e.g. generally opposing sides, at most) of the chip, it may be convenient to dice the wafers into strips of chips 62 in only one direction for this process in order to increase the number of chips which can be simultaneously processed and to ease chip handling requirements. However, uniformity between chips at different locations in each strip would not be guaranteed but may, nevertheless, be within the processing tolerances of the design. For example, an array of 3 mil wide metallized areas has been successfully formed on glass at a spacing of 5 mils over an extent of four inches with a regularity of spacing (with variation in dimensions and spacing much less than 1 mil) which is projected to be sufficient for application to current high density integrated circuit designs.

The tube mask 30 is preferably of metal or glass which has grooves 31 machined into one or more sides thereof, as may be desired or required by the package design. Preferably, for silicon chips, a molybdenum mask is used since it has a similar coefficient of thermal expansion (CTE) to silicon. Extremely fine grooves at close spacing are preferably provided over most of the length of tube 31 by electron discharge machining (EDM) which is well-understood in the art. Thus, the grooves divide the material of the tube into a generally comb-like pattern or shape. However, depending on the tube thickness and material, it may be preferred to terminate the grooves short of both ends of the tube so that the remaining material is not cantilevered but supported at both ends of the tube 30 to maintain accurate spacing between strips of remaining material. Other techniques such as lithography (e.g. etching) and laser ablation can also be used to form similar grooves in a tube or sheet, as depicted in FIGS. 6–8.

Figure 6:
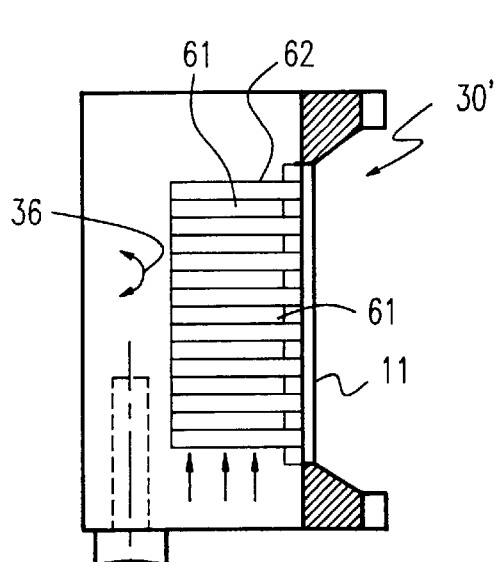
Figure 7:
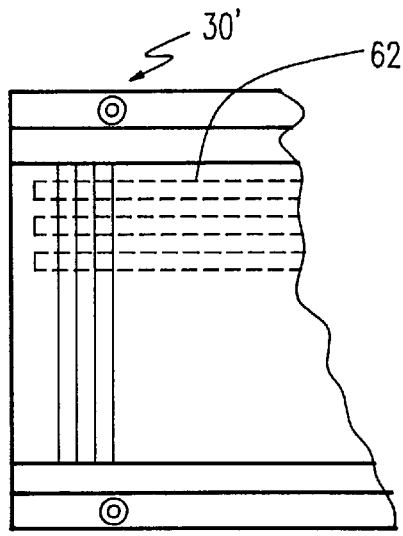
Figure 8:
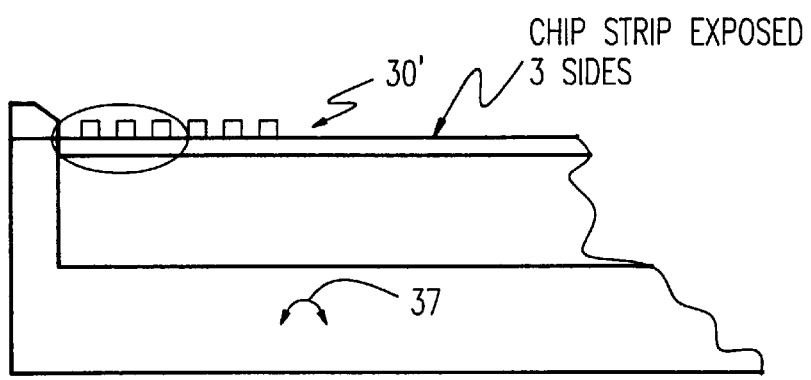
Figure 5:
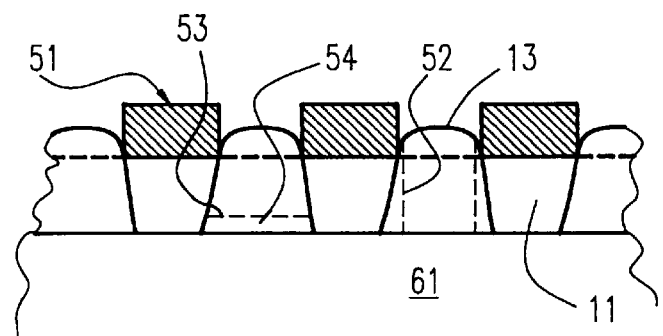

Alternatively, an array of parallel fine wires can be provided as a mask in much the same manner as depicted in FIGS. 6–8 (which is intended as generic thereto) and held in place by tension adjacent a stack of chips. (For fine features, one the wires should have a flat side which can be held closely against the chip edges.) However, in such a case, a holding arrangement for the chips, preferably including a clamping arrangement, and enclosure of the remainder of the chip surface must be separately provided. Further, it is considered preferable that the material between open spaces of the mask be of rectangular or trapezoidal cross-section, as shown in FIG. 5.

Figure 3A:
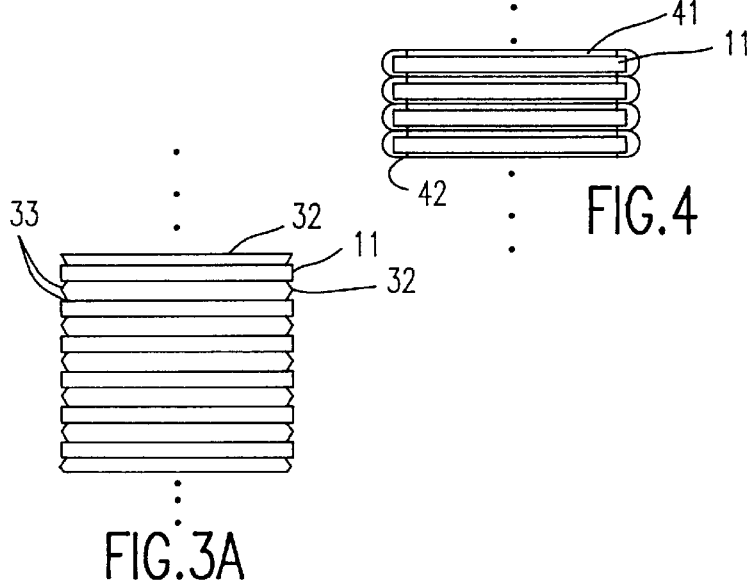
FIG. 3a shows stacking of chips and spacers for edge metallization of chips using a comb mask.

One or more chips 11 are inserted into or placed adjacent the mask and the individual chips are enclosed by spacers 32 which are bevelled at the locations of the grooves 31 in the comb mask 30 to expose portions of the major surfaces of the chip contiguous to the chip edge, as shown at 33 of FIG. 3a. Bevelling is preferred since it can be readily accomplished and provides both accurate positioning of the spacers without other salient features which bear against the tube mask 30 and regulated exposure of portions of the perimeter of the chips. Similar spacers are preferably placed at the ends of a stack including one or more chips in order to enclose all chips in the stack.

Alternatively, as shown in FIGS. 6–8 the bevelled portions of the spacers can be omitted and blocking masks 61 may be placed to define the desired extent of metallization contiguous to the chip edge and held in place by a clamping arrangement, best illustrated in FIG. 6, which provides compressional forces across the stack of chip or strips of chips 62 and spacers/blocking masks and a compressional force of the grooved mask against edges of the chips 11 or strips of chips 62.

Once chips are suitably enclosed within the comb mask tube 30 or the mask arrangement 30' shown in FIGS. 6–8, metallization may be directly performed by inserting the mask arrangement 30 or 30' in a metal deposition chamber and proceeding with a dry deposition process such as sputtering or evaporation by known methods. Advantageously, the mask arrangement containing the chips is rotated in an oscillatory fashion in two directions indicated by arrows 36 and 37 of FIG. 3. Direction 36 achieves substantial uniformity of deposition in metallization features over the length of each edge of each respective chip in view of the effective collimation provided by the mask. Direction 37 achieves substantial uniformity of metallization over the number of chips in the stack and within each metallization feature as it wraps around two corners to the major surfaces of each chip.

Specifically, FIG. 5 (taken in the same direction as the view of FIG. 8) shows the relationship of portions 51 the mask to the edges of blocking mask 61 and the edge of chip 11 and the deposit of metal achieved in accordance with the mask arrangements 30 or 30' in a metal evaporation or sputtering apparatus. The metal deposits are slightly trapezoidal in plan view due to motion 37 and will be tapered at the edges although a rectangular region indicated by dashed line 52 will be of substantially uniform thickness approximating that of the thickness of the deposit on the chip edge. Some decrease of thickness with increasing distance from the chip edge and toward the edge of blocking mask 61 may occur, depending on the angular extent and speed of motion 37 through that angle.

As a perfecting feature of the invention, it is preferred that the metal used for the adhesion layer not be solder-wettable (e.g. such as chromium) and that during application of the adhesion layer, the angular motion at least in direction 37 be slightly greater than the angular motion used during deposition of the high conductivity metal layer. Thus, the adhesion layer can be made to extend very slightly beyond the solder-wettable metal used for the conduction layer, as depicted by dashed lines 53 in FIG. 5 and will thus serve to limit solder flow laterally toward another metallization feature at locations where the metallizations are more proximate to each other due to their slightly trapezoidal shape.

It should also be understood that while dry metal deposition processes including but not limited to sputtering and evaporation are preferred for direct deposit of metal using mask arrangements 30 or 30' since the mask need not hermetically enclose the chip on areas which are not intended to receive metallization, other metal deposition techniques such as seeding and electroless deposition can be used. It is preferred to provide an adhesion layer of, for example, chromium followed by a layer of a highly conductive layer such as copper. Multi-layer composite structures can be used for either the adhesion or the highly conductive layers or both. Alloys or mixtures of such metals such as a mixture of chromium and copper can also be used to obtain high conductivity and high adhesion, particularly in combination with dry deposition and heat treatment. One or more barrier layers of, for example, a noble metal such as gold can be applied over the highly conductive metal layer, if desired.

As alluded to above, when a liquid is brought into contact with the substrate edges during the chosen metal deposition process, it is preferred to provide more hermetic masking than may be reliably available from the mechanical masks used in the manner described above. While the masking arrangements discussed above in regard to FIG. 3 and FIGS. 6–8 are effective to provide desired patterned deposition in the manner preferred for the practice of the invention, regardless of dry metal deposition methodology, liquid-tightness is not assured. During dry metal deposition techniques, the directionality of metal particles (as indicated, for example, in FIG. 8) can be exploited to allow use of such mechanical mask arrangements. Such directionality, unfortunately, is not available when metal is deposited from liquid solution. In such cases, it is preferred to use a lithographic resist to avoid liquid contact with the chips other than at areas on which metal is to be deposited, as will be discussed in connection with FIG. 4.

Figure 4:
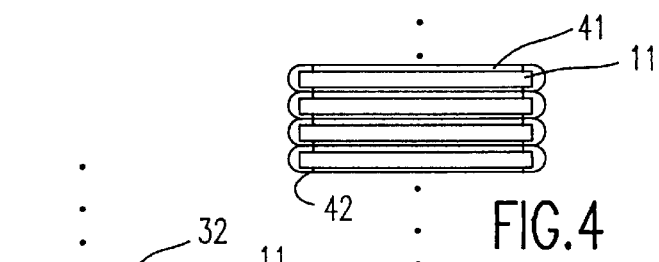
FIG. 4 illustrates use of a radiation sensitive mask for performing edge metallization in accordance with a variant method of practicing the invention, FIG. 5 in a detailed plan view of the metallization pattern developed in the manner discussed in connection with FIGS. 3 and 3a, and FIGS. 6, 7 and 8 are, respectively end, plan and side views of an alternative structure for achieving chip edge metallization such as is illustrated in FIG. 5.

In FIG. 4, a stack of chips 11 or strip of chips 62 is shown after each chip has been fully coated with resist 41. It is assumed that these chips are held in such a stack by a clamping arrangement for compressing the stack together but which is otherwise unimportant to the practice of the invention. This stack of chips 11 or strips of chips 62 is similar to those accommodated in the mechanical masks described above, except that spacers 31 or blocking masks 61 need not be employed. If such spacers or blocking masks are employed, it is only necessary to coat the edges and major surfaces of the chips 11 or strips of chips 62 to the extent that they extend beyond the edge of spacers 32 or blocking mask 61 and that the stack remain clamped together during the exposure, development and metallization process.

Exposure of the resist may be done at any wavelength suitable to the resist and the type of resist is not important to the practice of the invention. For purposes of this discussion and correlation with the above description of direct metallization, a positive resist is assumed but a negative resist could be used if a "negative" exposure is employed. The resist may be exposed with known lithographic exposure tools using a translation table permitting exact relative movement between the exposure radiation source and the stack of chips or using any form of a mask together with collimated exposure rediation. Alternatively, the stack of chips may be exposed using mechanical masks such as those described above for the exposure.

As is known, lithographic exposure radiation will be scattered for some depth within the resist and, to the extent that "blooming" of the exposure area can be sufficiently avoided, overexposure to a depth past the edges of the chips 11, as indicated at 42 of FIG. 4 is desirable. Alternatively, since development of the resist proceeds from the surface of the resist, overdevelopment (or a combination of overexposure and overdevelopment) can be used to the same effect. It should be also understood that once exposure has been accomplished, individual chips 11 or individual strips of chips 61 may be developed and metallized singly or in lesser numbers than present in the stack, particularly if resist is applied over the entirety of each chip. However, in general, no particular advantage is to be gained thereby while it is undesirable for resist-developing solutions to come into contact with chips since it presents the possibility for damage thereto. Such contact will be prevented simply by maintaining a compressive clamping force on the stack during resist development.

Once the resist has been developed to expose areas of each chip on which metallization is desired, metallization can be carried out by either dry processes or deposition from a liquid solution even without removing the chip stack from the mask arrangement. In this regard, an adhesion layer can be advantageously employed as described above. Further, the non-solder-wettable adhesion layer metal can be made to extend beyond the solder-wettable conduction layer to limit solder flow, as described above, either by the use, in sequence, of two resist masks having slightly different opening sizes, dry depositing the adhesion layer before resist masking or depositing non-solder wettable material on the edge of the resist within the openings such that the non-solder-wettable material 54 will remain adhered to the conductive metal layer when the resist is removed. This latter variant can be accomplished, for example, by electrolessly plating nickel on the resist and exposed chip or substrate followed by electroless deposition of copper. Then after the conductive metal is deposited and the resist removed, a block-out mask could be applied over the metal of the highly conductive layer and the nickel oxidized to form a non-solder-wettable barrier to solder flow. Seeding of the resist may allow the use of other adhesion layer materials, as well. When the metallization is complete, the remaining resist can be stripped and the stack can be dissembled (and further diced, if necessary) into individual chips to be assembled into any of the package configurations discussed above in connection with FIGS. 1, 1b and 2.

In view of the foregoing, it is clearly seen that a compact packaging structure for high density integrated circuits has been provided which permits maintaining of short signal paths and high switching frequencies with improved heat dissipation characteristics and improved mechanical robustness. Further, as a perfecting feature of the invention, a technique of chip support within the package using thermally conductive viscous fluids and containment therefore has been provided which enhances the reliability of the circuit package in service. Moreover, in support of the preferred form of the improved package structure and its efficient manufacture at high yield, an efficient technique for forming metallization features on chip edges and extending onto the major surfaces of the chips and mask arrangements for facilitating the technique with high yield have also been provided.

While the invention has been described in terms of a single preferred embodiment and variations thereof, those skilled in the art will recognize that the invention can be practiced with modification within the spirit and scope of the appended claims.

We claim:

1. A method of forming a metallization feature on an edge of an integrated circuit chip and extending onto both major surfaces of the integrated circuit chip, said method comprising the steps of enclosing said integrated circuit chip in a mask which exposes an area on an edge of said integrated circuit chip and areas on major surfaces of the integrated circuit chip contiguous to said area on said edge of said integrated circuit chip, and applying metal to said area of said edge of said integrated circuit chip and said areas on said major surfaces of said integrated circuit chip exposed by said mask, wherein said mask includes openings formed by grooves and said grooves are formed by laser ablation.

2. A method as recited in claim 1, wherein said depositing step is carried out by a dry deposition process.

3. A method as recited in claim 2, wherein said dry deposition process is sputtering.

4. A method as recited in claim 1, wherein said integrated circuit chip is included in a strip of integrated circuit chips.

5. A method as recited in claim 1, wherein said chip is included in a stack of integrated circuit chips.

6. A method as recited in claim 1, wherein said integrated circuit chip is included in a stack of integrated circuit strips of chips.

7. A method of forming a metallization feature on an edge of an integrated circuit chip and extending onto both major surfaces of the integrated circuit chip, said method comprising the steps of enclosing said integrated circuit chip in a mask which exposes an area on an edge of said integrated circuit chip and areas on major surfaces of the integrated circuit chip contiguous to said area on said edge of said integrated circuit chip, and applying metal to said area of said edge of said integrated circuit chip and said areas on said major surfaces of said integrated circuit chip exposed by said mask, wherein said mask is formed of a lithographic resist.

8. A method as recited in claim 7, wherein said resist is exposed using a mask including openings therein formed by grooves.

9. A method as recited in claim 7, wherein said depositing step is carried out by electroless deposition from a fluid solution.

10. A method of forming a metallization feature on an edge of a integrated circuit chip and extending onto both major surfaces of the integrated circuit chip, said method comprising the steps of enclosing a strip of integrated circuit chips in a mask which exposes an area on an edge of each of said integrated circuit chips and areas on major surfaces of each of said integrated circuit chips contiguous to said area on said edge of each of said integrated circuit chips, and applying metal to said area of said edge of each of said integrated circuit chip and said areas on said major surfaces of each of said integrated circuit chip exposed by said mask.

* * * * *